(12) United States Patent
Ookura et al.

(10) Patent No.: US 6,402,509 B1
(45) Date of Patent: Jun. 11, 2002

(54) SUBSTRATE PROCESSING APPARATUS AND SUBSTRATE PROCESSING METHOD

(75) Inventors: Jun Ookura; Koji Harada, both of Kikuyo-Machi (JP)

(73) Assignee: Tokyo Electron, Limited, Tokyo-To (JP)

( * ) Notice: Subject to any disclaimer, the term of this patent is extended or adjusted under 35 U.S.C. 154(b) by 0 days.

(21) Appl. No.: 09/653,161

(22) Filed: Sep. 1, 2000

(30) Foreign Application Priority Data

Sep. 3, 1999 (JP) ............................................. 11-249756

(51) Int. Cl.$^7$ ................................................. F27B 5/14
(52) U.S. Cl. ...................... 432/253; 118/20.1; 392/418; 219/405
(58) Field of Search .............................. 432/12, 43, 46, 432/31, 81, 253, 258; 392/416, 418; 219/390, 405, 411; 118/725, 728, 50.1

(56) References Cited

U.S. PATENT DOCUMENTS

| | | | |
|---|---|---|---|
| 5,059,770 A | * 10/1991 | Mahawili | ..................... 219/390 |
| 5,225,663 A | 7/1993 | Matsumura et al. | |
| 5,635,093 A | * 6/1997 | Arena et al. | ................. 118/725 |
| 5,802,856 A | * 9/1998 | Schaper et al. | ............. 392/418 |
| 5,834,737 A | * 11/1998 | Hirose et al. | ............... 392/418 |

FOREIGN PATENT DOCUMENTS

JP 11-219888 8/1999

* cited by examiner

*Primary Examiner*—Gregory Wilson
(74) *Attorney, Agent, or Firm*—Rader, Fishman & Grauer, PLLC

(57) ABSTRACT

Target processing temperatures for a wafer and offset values are tabulated and stored in a temperature controller in advance. When a target processing temperature is changed, a hot plate temperature corresponding to the target processing temperature for the wafer is calculated based on the offset value in the table. Based on the calculated value, a heater controller controls a heater to change the hot plate temperature. Thereby, in a substrate heat processing apparatus for performing heat processing at different temperatures, an offset value corresponding to each temperature is automatically changed, whereby the substrate can be heated at an appropriate temperature.

3 Claims, 10 Drawing Sheets

| TARGET PROCESSING TEMPERATURE (°C) | OFFSET VALUE (°C) |
|---|---|
| 90.0 | 1.0 |
| 130.0 | 1.0 |

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method.

2. Description of the Related Art

In fabrication of a semiconductor device, lithography processing is performed to form a resist pattern on a semiconductor wafer that is a substrate or an LCD substrate. In the lithography process, coating processing for applying a resist on a front face of the substrate, developing processing for performing developing processing for the exposed substrate, heat processing which is performed before and after the exposure processing and after the developing processing, cooling processing for cooling the substrate to a predetermined temperature after the heat processing, and the like are performed.

In the aforesaid heat processing, there are prebaking processing for performing vaporization of a remaining solvent in the resist, post-exposure baking processing for reducing deformation of a resist pattern before the developing, post-prebaking processing for vaporizing remaining wafer after the developing, and the like.

Such heat processing for the substrate is performed by heating a hot plate to a predetermined temperature by means of a heater that is a heating element and mounting the substrate on the hot plate in a heat processing apparatus. However, there usually arises a temperature difference between the temperature of the hot plate and the temperature of the front face of the heated substrate because heat energy is lost when being transmitted. Hence, the difference is set as an offset value in advance and the hot plate temperature is set at a temperature higher than a target processing temperature for the substrate by the offset value so as to heat the substrate at a predetermined temperature.

However, in the case where heat processing is performed at a plurality of target processing temperatures in one heat processing apparatus, since the offset value is different with respect to the target processing temperature, it is necessary to reset the offset value for every change, thereby bringing about deterioration in throughput. If the offset value is fixed at one value, the substrate can not be heated at an optimal temperature, thereby causing deterioration in yield.

SUMMARY OF THE INVENTION

The present invention is made under the above circumstances and an object thereof is to provide a substrate processing apparatus and a substrate processing method in which when a substrate is temperature-controlled at a plurality of target processing temperatures in one substrate processing apparatus, the temperature of a plate on which the substrate is mounted is automatically changed to an appropriate temperature based on an offset value corresponding to the target processing temperature.

To attain the above object, in a main first aspect of the present invention, provided is a substrate processing apparatus comprising: a plate on which a substrate is placed and including temperature control means for setting the substrate at a target processing temperature; storage means for storing a plurality of the target processing temperatures and a temperature difference between the target processing temperature and an actual temperature of the plate when the plate is set at the target processing temperature for each of the plurality of target processing temperatures; and control means for controlling the temperature control means to change the temperature of the plate based on the temperature difference stored for each of the plurality of target processing temperatures.

According to the above configuration of the present invention, the temperature of the plate can be automatically changed with considerations of a temperature difference between each of the target processing temperatures and the actual temperature of the plate with changes in target processing temperature for the substrate. Therefore, even if the target processing temperature for the substrate is changed, the substrate is processed at an appropriate temperature, thereby improving yields. Further, it is unnecessary to reset the temperature of the plate for every change, resulting in improved throughput.

In a second aspect of the present invention, provided is a substrate processing apparatus comprising: a plate on which a substrate is placed and including temperature control means for each of partitioned areas for setting the substrate at a target processing temperature; storage means for storing a plurality of the target processing temperatures and a temperature difference between the target processing temperature and an actual temperature of the plate when the plate is set at the target processing temperature for each of the plurality of target processing temperatures for each of the areas; and control means for controlling each of the temperature control means to change the temperature of the plate in each of the areas based on the temperature difference stored for each of the plurality of target processing temperatures.

According to the above configuration of the present invention, even if the target processing temperature for the substrate is changed, the plate temperature is individually changed by the heating element individually provided in each area, whereby the substrate is temperature-controlled at an appropriate temperature. Further, non-uniformity in temperature control within the same substrate can be corrected, whereby the substrate is uniformly temperature-controlled, resulting in improved yields.

In a third aspect of the present invention, provided is a substrate processing method for temperature-controlling a plate to set a substrate on the plate at a target processing temperature comprising the steps of: storing a plurality of the target processing temperatures; storing a temperature difference between the target processing temperature and an actual temperature of the plate when the plate is heated to the target processing temperature for each of the plurality of target processing temperatures; obtaining a predetermined temperature to which the plate needs to be temperature-controlled based on the target processing temperature and the temperature difference; and temperature-controlling the plate to the predetermined temperature.

According to the above configuration of the present invention, it is possible to store a plurality target processing temperatures for the substrate and temperature differences between the target processing temperatures and actual plate temperatures corresponding to the target processing temperatures and obtain the plate temperature from those values to change the temperature of the plate. Accordingly, even if the target processing temperature for the substrate is changed, the substrate is processed at an appropriate temperature, thereby improving yields. Further, since the plate temperature is automatically changed, it is unnecessary to reset the temperature of the plate for every change, resulting in improved throughput.

In a fourth aspect of the present invention, provided is a substrate processing method for temperature-controlling a plate to temperature-control a substrate on the plate to a target processing temperature comprising the steps of: storing a plurality of the target processing temperatures; storing a temperature difference between the target processing temperature and an actual temperature of the plate in each of partitioned areas of the plate when the plate is temperature-controlled to the target processing temperature for each of the plurality of target processing temperatures; obtaining a predetermined temperature to which the plate needs to be heated for each of the areas based on the target processing temperature and the temperature difference; and temperature-controlling the plate to the predetermined temperature.

According to the above configuration of the present invention, even if the target processing temperature for the substrate is changed, the plate temperature is individually changed in each area, whereby the substrate is heated at an appropriate temperature. Further, non-uniformity in heating temperature within the substrate plane is corrected, whereby the substrate is uniformly processed, resulting in improved yields.

In a fifth aspect of the present invention, provided is a substrate processing method comprising the steps of: mounting a first substrate on a hot plate including a heating element and set at a predetermined temperature and heating the first substrate; removing the first substrate from a top of the hot plate; heating the hot plate at a temperature higher than the predetermined temperature and thereafter heating the hot plate at the predetermined temperature; and mounting a second substrate on the hot plate and heating the second substrate.

According to the above configuration of the present invention, even if the temperature of the hot plate decreases to be lower than the predetermined temperature due to the processing for the first substrate, the hot plate is heated at a temperature higher than the predetermined temperature before the second substrate which is subsequently processed is carried in, whereby the hot plate can be quickly returned to a desired predetermined temperature, resulting in improved throughput.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
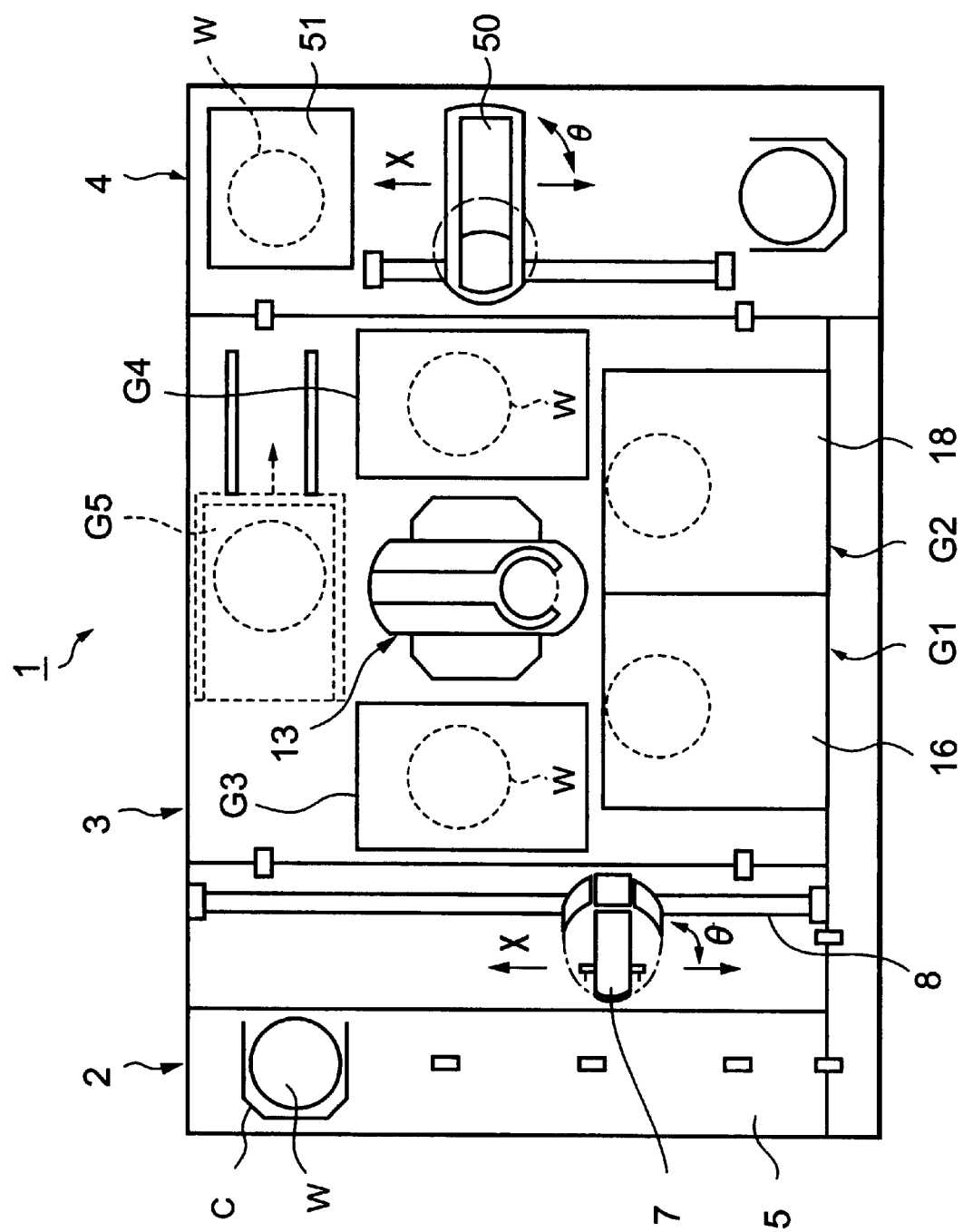
FIG. 1 is a plan view showing an appearance of a coating and developing processing system including a heat processing apparatus according to this embodiment.
Figure 2:
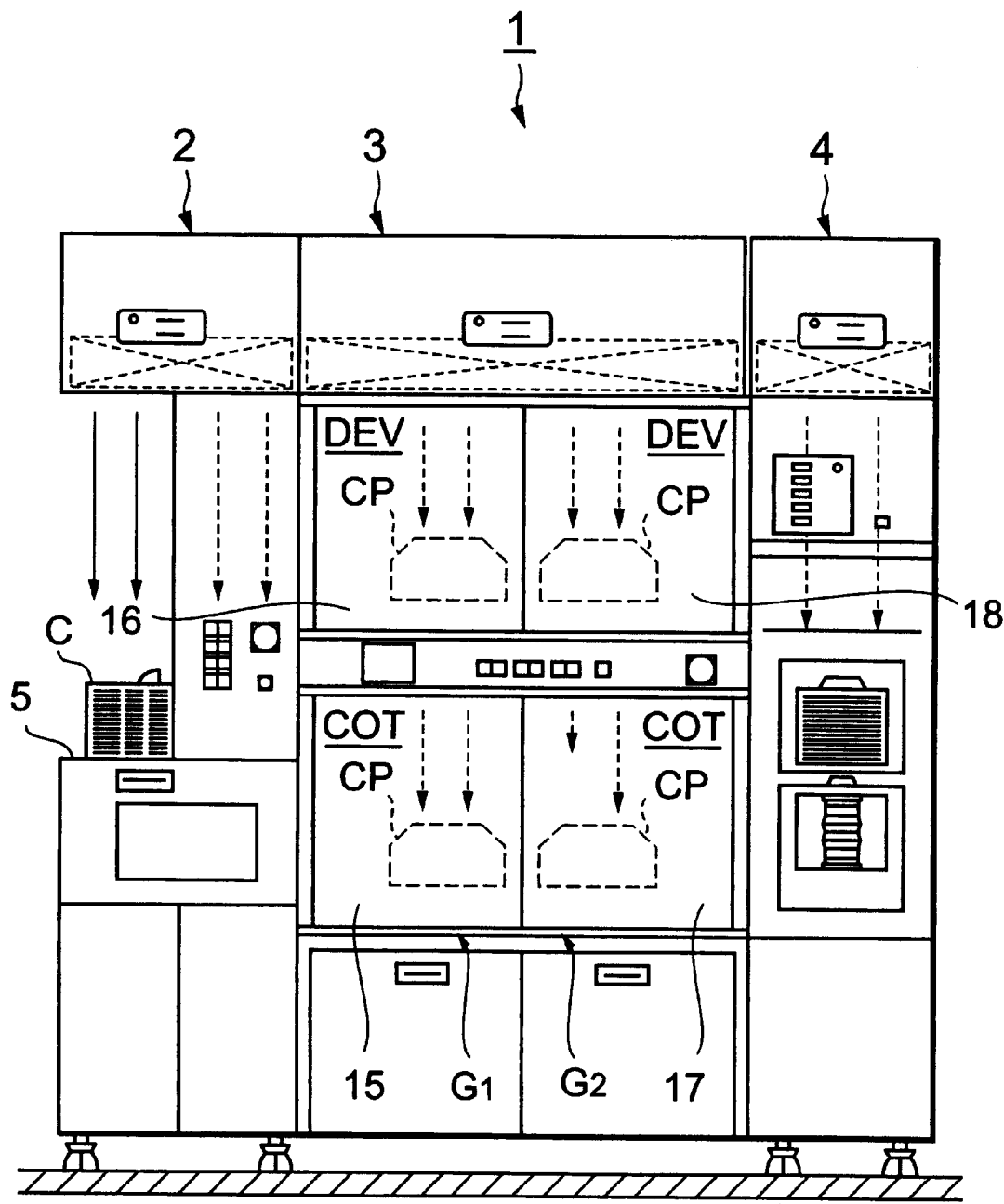
FIG. 2 is a front view of the coating and developing processing system in FIG. 1.
Figure 3:
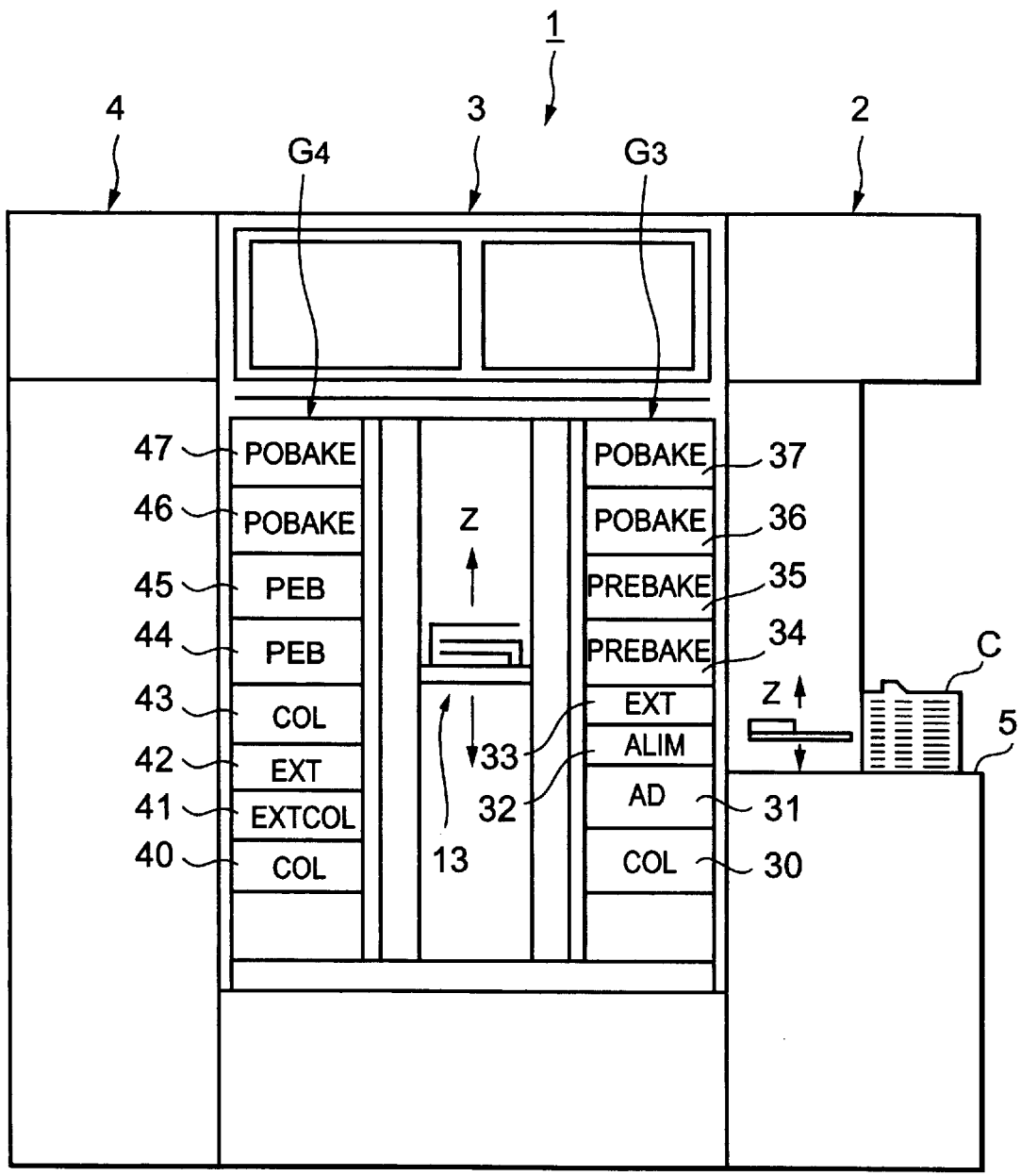
FIG. 3 is a rear view of the coating and developing processing system in FIG. 1.

FIG. 1 is a plan view of a coating and developing processing system 1 in which a prebaking unit as a heat processing apparatus for a substrate according to this embodiment is incorporated, FIG. 2 is a front view of the coating and developing processing system 1, and FIG. 3 is a rear view of the coating and developing processing system 1.

The coating and developing processing system 1 has a configuration in which a cassette station 2 for carrying, for example, 25 wafers W per cassette from/to the outside to/from the coating and developing processing system 1, and for carrying the wafers W into/out of a cassette C, a processing station 3 in which various processing units for performing predetermined processing to the wafers W one by one in a coating and developing process are multi-tiered, and an interface section 4, which is provided adjacent to the processing station 3, for delivering the wafer W to/from an aligner (not shown) are integrally connected.

In the cassette station 2, a plurality of cassettes C are mountable in a line in an X-direction (in a vertical direction in FIG. 1), at predetermined positions on a cassette mounting table 5 that is a mounting section. A wafer transfer body 7 transportable in the direction of arrangement of the cassettes (the X-direction) and in the direction of arrangement of the wafers W housed in the cassettes C (a Z-direction; a vertical direction), is provided to be movable along a transfer path 8 and to selectively get access to each cassette C.

The wafer transfer body 7 is structured to be accessible to an alignment unit 32 and an extension unit 33 included in a third processing unit group G3 on the processing station 3 side as will be explained later.

In the processing station 3, a main transfer apparatus 13 is disposed at the center thereof and various kinds of processing units are multi-tiered around the main transfer apparatus 13 to form processing unit groups. In the coating and developing processing system 1, four processing unit groups G1, G2, G3, and G4 are arranged and the first and second processing unit groups G1 and G2 are arranged on the front side of the coating and developing system 1, the third processing unit group G3 is arranged adjacent to the cassette station 2, and the fourth processing unit group G4 is arranged adjacent to the interface section 4. Moreover, a fifth processing unit group G5 shown by a broken line as an option can be additionally arranged on the rear side.

As shown in FIG. 2, in the first processing unit group G1, two kinds of spinner-type processing units, for example, a resist coating unit 15 for applying a resist to the wafer W to process it and a developing processing unit 16 for supplying a developing solution to the wafer W to process it are two-tiered from the bottom in order. Similarly in the second processing unit group G2, a resist coating unit 17 and a developing processing unit 18 are two-tiered from the bottom in order.

As shown in FIG. 3, in the third processing unit group G3, a cooling unit 30 for performing cooling processing for the wafer W, an adhesion unit 31 for enhancing fixedness of the resist solution and the wafer W, an alignment unit 32 for performing alignment of the wafer W, an extension unit 33 for allowing the wafer W to wait, prebaking units 34 and 35 according to this embodiment for performing heat processing before exposure processing, postbaking units 36 and 37 for performing heat processing after developing processing, and the like are eight-tiered from the bottom in order.

In the fourth processing unit group G4, a cooling unit 40, an extension and cooling unit 41 for allowing the mounted wafer W to be naturally cooled, an extension unit 42, a cooling unit 43, post-exposure baking units 44 and 45 for performing heat processing for the wafer W after exposure processing, postbaking units 46 and 47, and the like are eight-tiered from the bottom in order.

A wafer transfer body 50 is provided in the central portion of the interface section 4. The wafer transfer body 50 is configured to be accessible to the extension and cooling unit 41 and the extension unit 42 included in the fourth processing unit group G4, an edge aligner 51, and the aligner (not shown).

Figure 4:
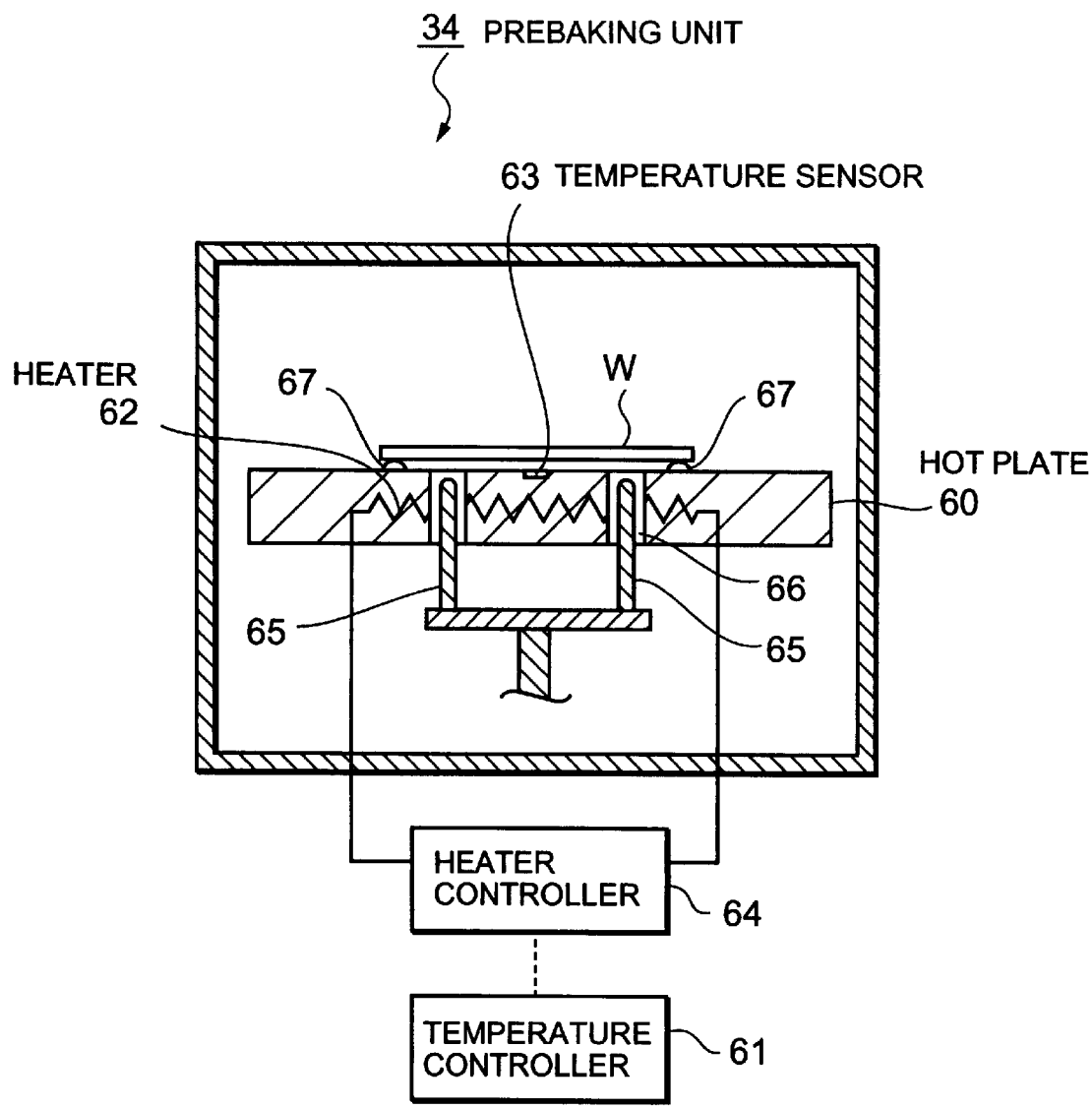
FIG. 4 is an explanatory view of a vertically sectional view showing the structure of a heat processing apparatus according to this embodiment.
Figure 5:
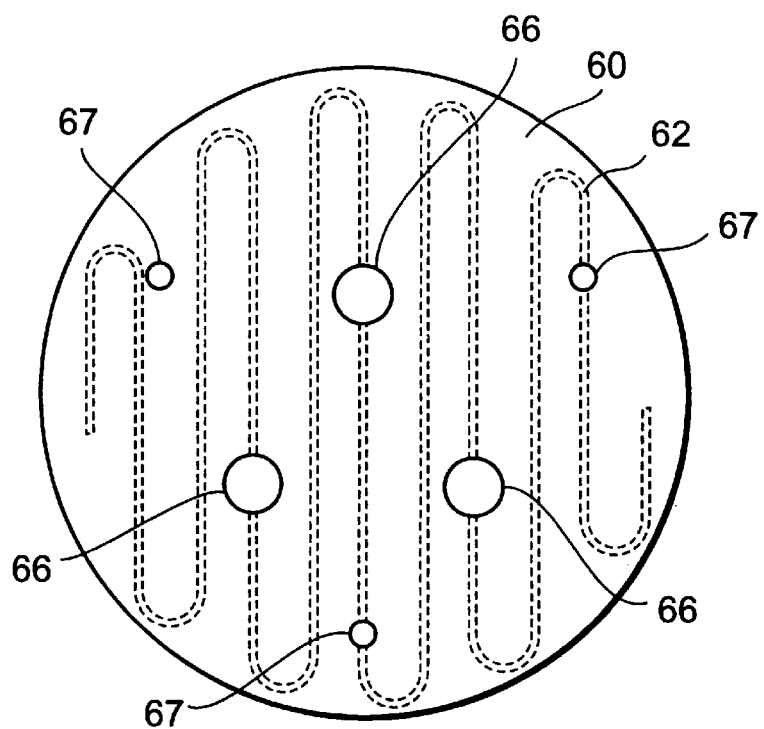
FIG. 5 is a plan view of a hot plate of a heat processing apparatus according to a first embodiment.

The prebaking unit 34 according to this embodiment includes a disc-shaped hot plate 60 for mounting the wafer W thereon and heating it as shown in FIG. 4 and a temperature controller 61 for controlling the temperature of the hot plate 60. A heater 62, which is patterned, as a heating element is embedded in the hot plate 60 as shown in FIG. 5. Further, a temperature sensor 63 for measuring the temperature of the hot plate 60 is provided in the vicinity of the center thereof.

Figure 6:
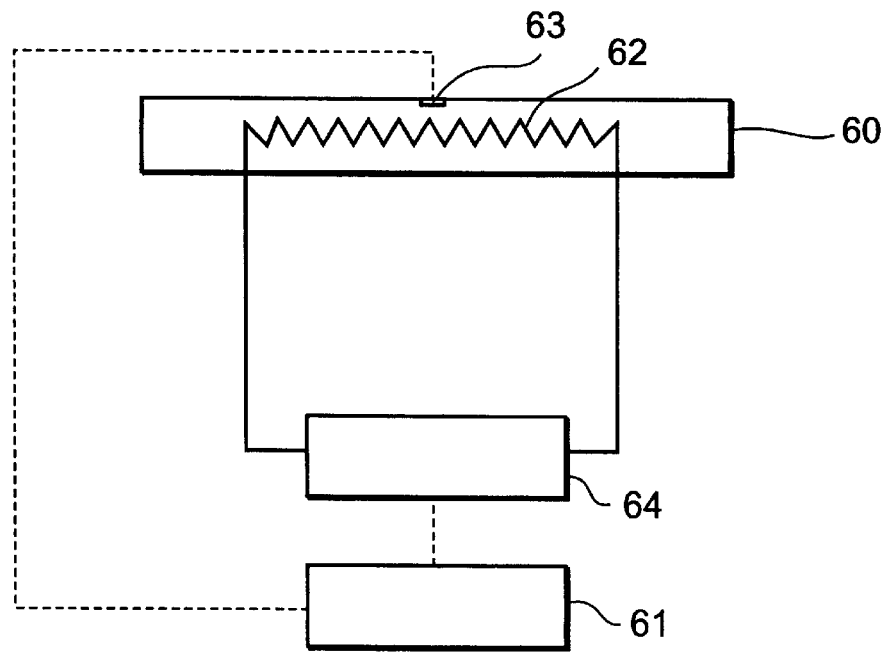
FIG. 6 is a schematic layout of controllers according to the first embodiment.

The temperature controller 61 has a function of storing a plurality of target processing temperatures of the wafer W and differences in temperature (hereinafter, referred to as "offsets") between the target processing temperatures and actual hot plate temperatures with respect to the target processing temperatures and a function of obtaining a corresponding hot plate temperature when the target processing temperature for the wafer W is changed or set based on the target processing temperatures and the offset values which have been stored in advance. The temperature controller 61 is connected to the temperature sensor 63 of the hot plate 60 and a heater controller 64 as shown in FIG. 6 to provide data to the heater controller 64 based on a measured temperature by the temperature sensor 63. Further, the heater controller 64 is configured to change the voltage of the heater 62 to adjust the temperature of the hot plate 60 based on the data from the temperature controller 61.

Moreover, the prebaking unit 34 is provided with three raising and lowering pins 65 for raising and lowering the wafer W when the wafer W is carried in/out. The raising and lowering pins 65 are ascendable and descendable in through holes 66 penetrating the hot plate 60 by means of a drive mechanism not shown. Moreover, proximity pins 67 for supporting the wafer W while the wafer W is slightly lifted off the front face of the hot plate 60 are disposed on the hot plate 60.

Next, operations of the prebaking unit 34 configured as above will be explained with a process of coating and developing processing for the wafer W performed in the coating and developing processing system 1.

First, the wafer transfer body 7 takes one unprocessed wafer W out of a cassette C and carried it into the alignment unit 32 included in the third processing unit group G3. Then, the wafer W for which alignment has been completed in the alignment unit 32 is transferred to the adhesion unit 31, the cooling unit 30, and the resist coating unit 15 or 17 in order by the main transfer apparatus 13 to be subjected to predetermined processing. Thereafter, the wafer W is transferred to the prebaking unit 34 or 35 each for vaporizing the remaining solvent in the resist.

Figure 7:
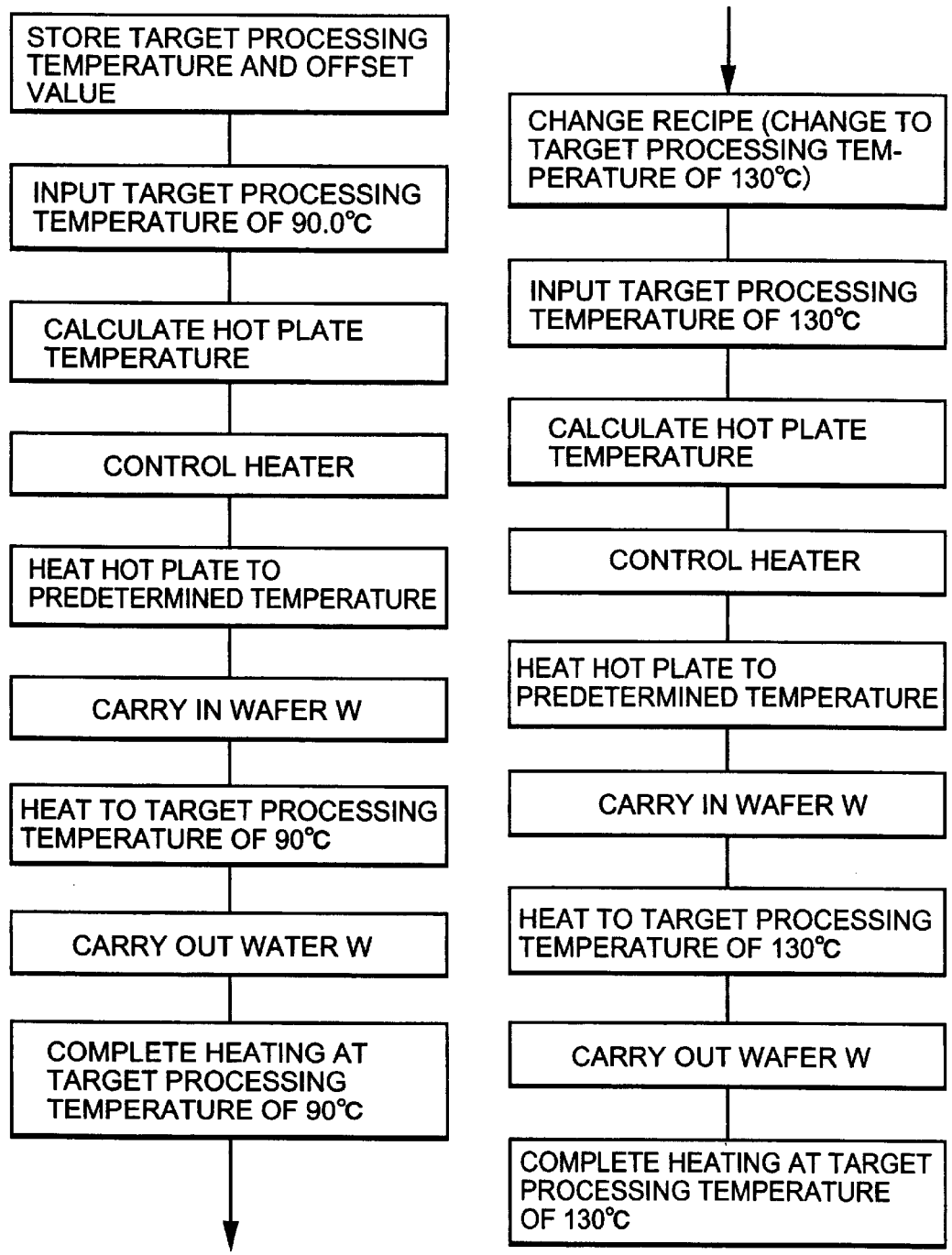
FIG. 7 is a flowchart showing a process of heat processing using the heat processing apparatus according to the first embodiment.

A heating process for the wafer W which is subjected to heat processing in the prebaking unit 34 will be explained here in accordance with a flow in FIG. 7.

Figures 8, 9:
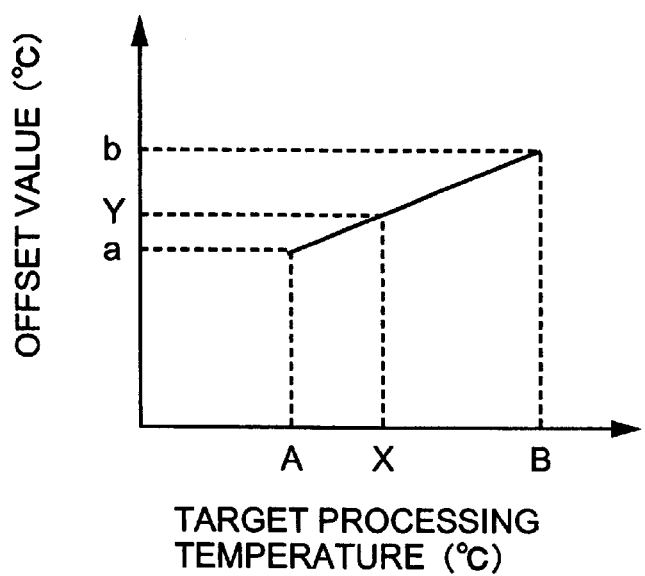
FIG. 8 is a table showing examples of relations between heating set temperatures and offset values that are checked in advance.
FIG. 9 is a graph in which the relations between the heating set temperatures and the offset values are figured as a linear function.

Here, before the heat processing is performed, offset values of, for example, 1.0° C. and 2.0° C. with respect to a plurality of target processing temperatures for the wafer W, for example, target processing temperatures of 90.0° C. and 130.0° C., are checked in advance, and the relations are tabulated as shown in FIG. 8 and stored in the temperature controller 61.

The wafer W for which the previous process has been completed is transferred to the prebaking unit 34 by the main transfer apparatus 13. Next, the wafer W is delivered to the raising and lowering pins 65 which have ascended and waited at a position above the hot plate 60 in advance. The wafer W supported by the raising and lowering pins 65 is lowered with the descent of the raising and lowering pins 65 to be mounted on the proximity pins 67 on the hot plate 60, whereby the prebaking processing is started. The hot plate 60 has been preheated to a predetermined temperature as follows.

First, the target processing temperature of 90.0° C. for the wafer W is input to the temperature controller 61 in accordance with a recipe. Then, in the temperature controller 61, a predetermined hot plate temperature is obtained based on the offset value of 1.0° C., which has been stored in advance, with respect to the target processing temperature of 90.0° C. The temperature controller 61 inputs the data of the obtained hot plate temperature of 91.0° C. (90.0+1.0) into the heater controller 64. The heater controller 64 adjusts the voltage in accordance with the data to control the heating value of the heater 62. Therefore, the hot plate 60 is heated to the predetermined temperature. Thereafter, the wafer W is carried into the prebaking unit 34 and mounted on the hot plate 60 as described above.

The wafer W mounted on the hot plate 60 is heated to 90.0° C. that is the target processing temperature with the hot plate temperature of 91.0° C. and heated for a predetermined period of time. The wafer W for which the heating has been completed is again raised by the raising and lowering pins 65, delivered to the main transfer body 13, and carried out of the prebaking unit 34.

Here, the processing for the wafer W which needs prebaking at the target processing temperature of 90.0° C. is completed. Next, the case where processing for the wafer W which needs prebaking at a temperature of, for example, 130.0° C. is performed will be explained.

First, the target processing temperature of 130.0° C. for the wafer W in accordance with a new recipe is input to the temperature controller 61. Then, in the temperature controller 61, a predetermined hot plate temperature is obtained based on the offset value of 2.0° C., which has been stored in advance, with respect to the new target processing temperature of 130.0° C. The temperature controller 61 inputs the data of the obtained hot plate temperature of 132.0° C. (130.0+2.0) into the heater controller 64. The heater controller 64 adjusts the voltage in accordance with the data to control the heating value of the heater 62. Hereinafter, prebaking processing for the wafer W is performed in the same manner as above until the target processing temperature is changed.

When the temperature is changed to a target processing temperature X which has not been stored in the temperature controller 61 in advance, the relations between the other offset values a and b and the target processing temperatures A and B which have been stored in advance are figured as a linear function as shown in FIG. 9 to calculate an offset value, and an appropriate hot plate temperature Y is obtained based on the offset value. For example, the hot plate temperature Y when the target processing temperature is X can be obtained by an expression of $Y=X+(b-a)/(B-A)*X+(aB-Ab)/(B-A)$ where the stored target processing temperatures are A and B and the previously stored offset values corresponding to A and B are a and b respectively. For example, when the target processing temperature X is 110.0° C. with values of a=1.0° C., b=2.0° C., A=90.0° C., and B=130.0° C., the hot plate temperature Y=110.0+1.5=111.5° C. is obtained from the above expression. The temperature controller 61 may be configured such that the hot plate temperature is obtained from the correlation between the target processing temperatures and the offset values as described above so as to automatically control the heater 62. Consequently, when heat processing is performed for a wafer W with a target processing temperature of 110.0° C., the hot plate temperature is automatically set at 111.5° C. and prebaking processing is performed.

Thereafter, a new wafer W is transferred into the prebaking unit 34 and subjected to heat processing in a predetermined process.

Through the use of the prebaking unit 34 according to the above embodiment, even if the target processing temperature for the wafer W is changed, an appropriate heating temperature of the hot plate 60 is calculated based on the offset value corresponding to each of the target processing temperatures which have been stored in advance to automatically control the heater 62. Therefore, even when performing heat processing at a different target processing temperature in accordance with a recipe, the prebaking unit 34 can perform heat processing for the wafer W at an optimal temperature. Further, it is unnecessary to reset the temperature of the hot plate for every change in target processing temperature for the wafer W, resulting in improved throughput.

The wafer W for which the heat processing has been completed in the above-described prebaking unit 34 is cooled in the extension and cooling unit 41 and thereafter a series of predetermined processing such as edge exposure processing, exposure processing, developing processing and the like is performed.

Next, a prebaking unit 34 of which a hot plate is concentrically partitioned and including a heater as a heating element in each partitioned area will be explained as a second embodiment.

Figure 10:
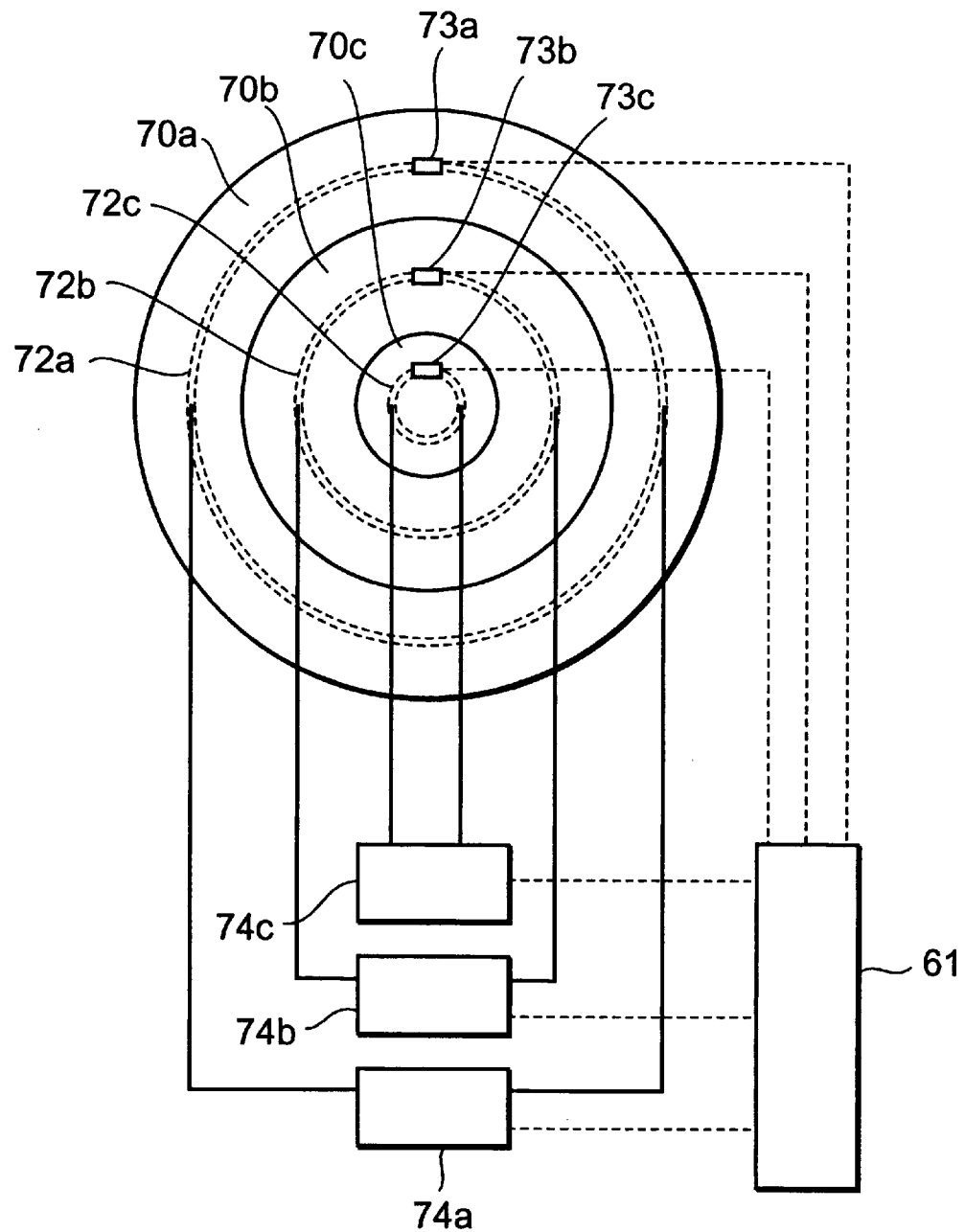
FIG. 10 is an explanatory view of a partitioned hot plate according to a second embodiment.
Figure 11:
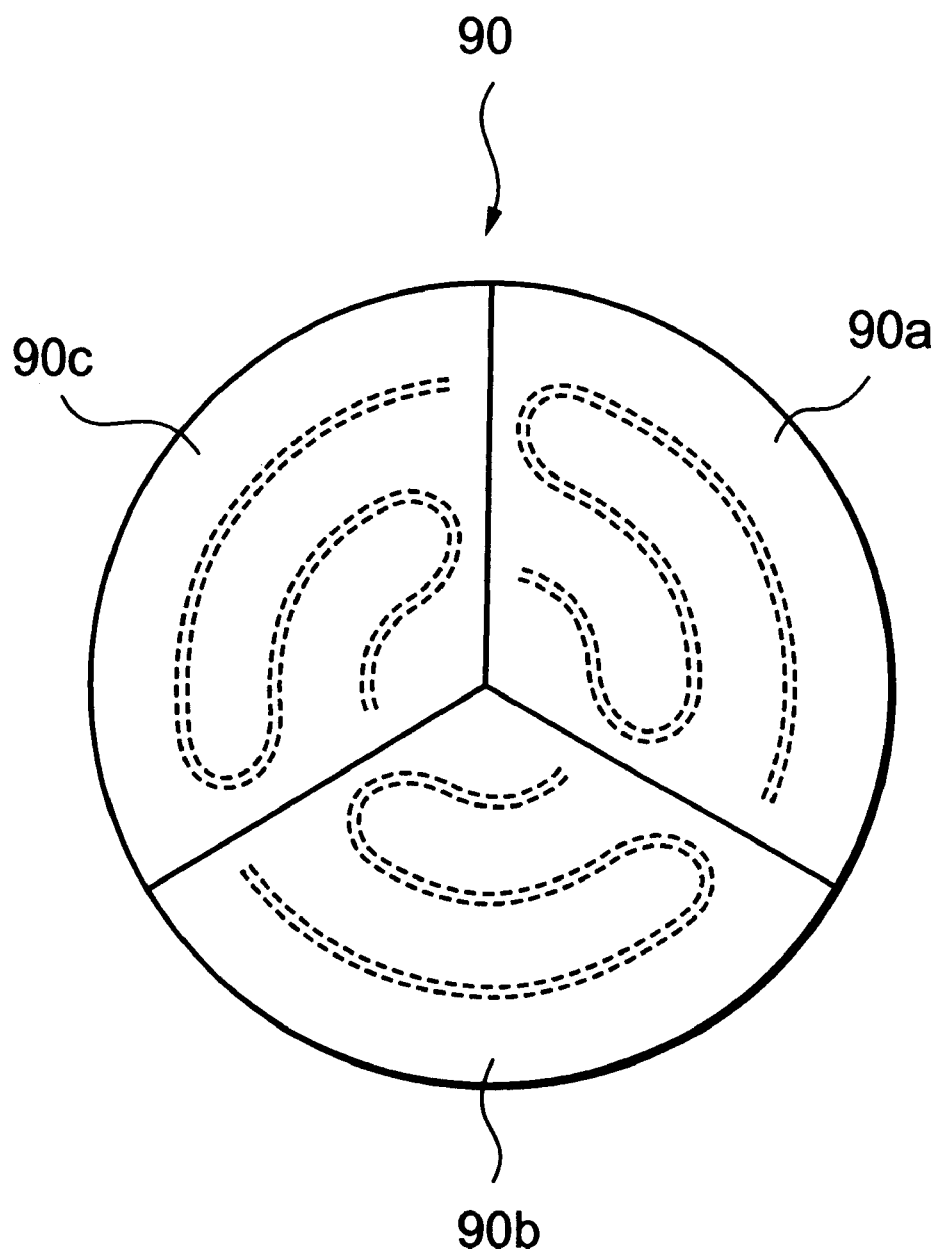
FIG. 11 is another partition example of a hot plate according to the second embodiment.

As shown in FIG. 10, a hot plate 70 is concentrically partitioned into three, and heaters 72a, 72b, and 72c as heating elements are embedded in partitioned areas 70a, 70b, and 70c respectively. The heaters 72a, 72b, and 72c include heater controllers 74a, 74b, and 74c respectively. The heater controllers 74a, 74b, and 74c are connected to a temperature controller 61 to be separately controlled. The temperature controller 61 has a function of separately storing a plurality of target processing temperatures for the wafer W and offset values with respect to the target processing temperatures for each of the areas 70a, 70b, and 70c and a function of obtaining a predetermined hot plate temperature for each of the areas 70a, 70b, and 70c based on the values which have been stored in advance when the target processing temperature for the wafer W is changed or set to control each of the heater controllers 74a, 74b, and 74c. Further, each of temperature sensors 73a, 73b, and 73c is attached to a portion close to the front face of the hot plate 70 in each of the areas 70a, 70b, and 70c. The temperature sensors 73a, 73b, and 73c are individually connected to the temperature controller 61.

When the target processing temperature is changed, the hot plate temperature for each of the areas 70a, 70b, and 70c is obtained based on the offset value which has been previously stored for each of the areas 70a, 70b, and 70c to control each of the heaters 72a, 72b, and 72c so as to change the hot plate temperature in each of the areas 70a, 70b, and 70c as in the first embodiment. Further, even when the temperature is changed to a target processing temperature which has not been stored, the temperature controller 61 calculates the temperature of the hot plate 70 based on the stored target processing temperatures and offset values for each of the areas 70a, 70b, and 70c to control the heaters 72a, 72b, and 72c by the heater controllers 74a, 74b, and 74c in the respective areas 70a, 70b, and 70c.

Generally, when the wafer W on the hot plate 70 is heated by the hot plate 70, the closer to the peripheral portion of the wafer W it becomes, the more an amount of heat is radiated to the outside, with the result that the offset value in each of the areas 70a, 70b, and 70c is naturally different.

As for the above point, according to the second embodiment, when the target processing temperature for the wafer W is changed, each offset value with respect to the target processing temperature in each of the partitioned areas 70a, 70b, and 70c of the hot plate 70 is stored in advance, and the temperature of the hot plate 70 can be automatically adjusted in each of the areas 70a, 70b, and 70c based on the offset value. Therefore, even when the wafer W is subjected to heat processing at a different target processing temperature according to a recipe, the heat processing can be performed at optimal temperatures at the central portion and the peripheral portion of the wafer W. Further, it is unnecessary to reset the temperature of the hot plate for every change in the target processing temperature for the wafer W, resulting in improved throughput. Furthermore, non-uniformity in heating temperature within the same wafer W can be adjusted, thereby uniformly processing the wafer W and improving yields.

The hot plate 70 is concentrically partitioned in the second embodiment, but a hot plate 90 may be radially partitioned from the center into a plurality, for example, three.

Figure 12:
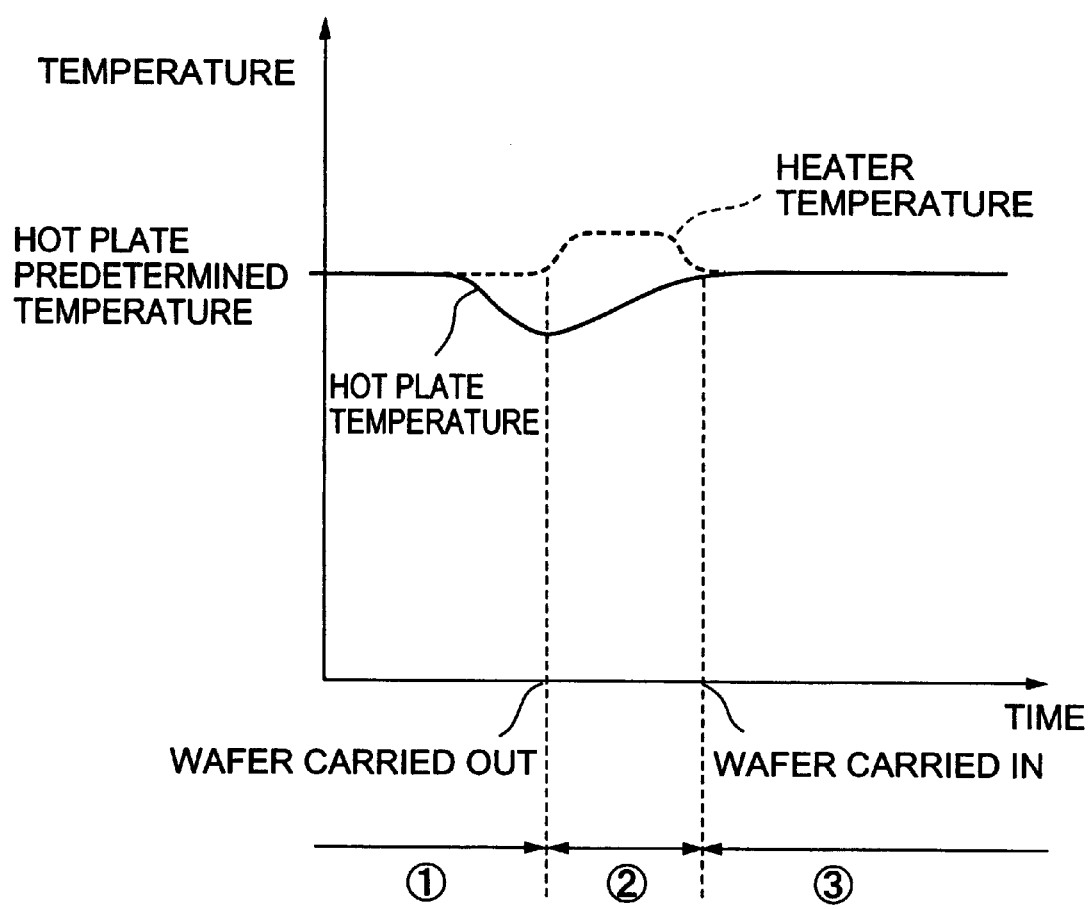
FIG. 12 is a graph showing temperature changes of a hot plate and a heater with carry in/out of a wafer.

Further, in the aforesaid embodiments, there arises a temperature fall in the hot plate itself by the wafer W being mounted on the hot plate in the processing for the wafer W in the prebaking unit. Therefore, when a wafer W to be subsequently processed is processed at the same temperature, it is necessary to heat the hot plate to reset the hot plate at the predetermined temperature by the time of the processing for the following wafer W. FIG. 12 is a graph showing temperature changes of the hot plate and the heater due to carry in/out of the wafer W. The horizontal axis shows time and the vertical axis shows temperature of the hot plate and the heater. In the graph, a solid line shows temperature changes in the hot plate and a broken line shows temperature changes in the heater. This graph presupposes that there is no heat loss in heat transmission from the heater to the entire hot plate. As shown in FIG. 12, heat is transmitted from the hot plate to the wafer W, whereby the temperature of the hot plate gradually lowers during the heat processing period for a first wafer W (period of ① in FIG. 12). It should be noted that the heater is set at the same temperature as a predetermined temperature of the hot plate during the heat processing period for the first wafer W. Thus, the temperature of the heater is set at a temperature higher than the predetermined temperature of the hot plate during a period from when the first wafer W which has been subjected to the heat processing is carried out to when a second wafer W is carried in (period of ② in FIG. 12) for the following wafer processing. Thereby, the temperature of the hot plate can be returned to the predetermined temperature more quickly than the case in which the heater is kept at the same temperature as the predetermined temperature of the hot plate, so that the total processing time can be reduced. After being set at the temperature higher than the predetermined temperature of the hot plate, the heater is set at the same temperature as the predetermined temperature of the hot plate before the second wafer W is carried in. After the hot plate is set at the predetermined temperature, the second wafer W is carried into a processing chamber to be subjected to heat processing (period of ③ in FIG. 12).

The above-described heat processing apparatus is the prebaking unit in the coating and developing processing system, but it may be applied to other heat processing apparatuses of the coating and developing system, for example, the post-exposure baking unit, postbaking unit, and the adhesion unit. Further, as for a substrate, the heat processing apparatus is applicable not only to a disc-shaped substrate such as a wafer but also to a square substrate such as an LCD substrate. Further, the present invention is not limited to the heat processing apparatus but applicable to a cooling processing apparatus for cooling a substrate. In this case, though the hot plate provided with the heater as temperature control means is used in the aforesaid embodiments, a cooling plate provided with a pipe through which a temperature controlling water passes in the plate may be used as the temperature control means.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing method, comprising the steps of:

mounting a first substrate on a hot plate including a heating element and set at a predetermined temperature and heating the first substrate;

removing the first substrate from a top of the hot plate;

heating the hot plate at a temperature higher than the predetermined temperature and thereafter heating the hot plate at the predetermined temperature; and mounting a second substrate on the hot plate and heating the second substrate.

2. The method as set forth in claim 1, wherein the first substrate and the second substrate are heated to the target processing temperature by the hot plate, and wherein said heating step further comprises:
    storing the target processing temperature;
    storing a temperature difference between the target processing temperature and an actual temperature of the hot plate when the hot plate is heated to the target processing temperature;
    obtaining the predetermined temperature to which the hot plate needs to be heated based on the target processing temperatur e and the temperature difference; and
    heating the hot plate to the predetermined trtemperature.

3. The method as set forth in claim 1, wherein the first substrate and the second substrate are heated to the target processing temperature by the hot plate, and wherein said heating step further comprises:
    storing the target processing temperature;
    storing a temperature difference between the target processing temperature and an actual temperature of the hot plate in each of partitioned areas of the hot plate when the hot plate is heated to the target processing temperature;
    obtaining a predetermined temperature to which the hot plate needs to be heated for each of the areas based on the target processing temperature and the temperature difference; and
    heating the hot plate to the predetermined temperature.

* * * * *